(12) United States Patent
Tay et al.

(10) Patent No.: US 11,937,369 B2
(45) Date of Patent: Mar. 19, 2024

(54) TRACEABILITY OF SUBSEQUENT LAYER STRUCTURE MANUFACTURING OF MAIN BODY FOR COMPONENT CARRIERS BY MEANS OF LATERALLY AND VERTICALLY DISPLACED INFORMATION CARRYING STRUCTURES

(71) Applicant: AT&S (China) Co. Ltd., Shanghai (CN)

(72) Inventors: Seok Kim Tay, Singapore (SG); Azmi Ibrahim, Ipoh (MY); Wenping Dai, Singapore (SG); Chunjie Shen, Kunshan (CN)

(73) Assignee: AT&S(China) Co. Ltd., Shanghai (CN)

( * ) Notice: Subject to any disclaimer, the term of this patent is extended or adjusted under 35 U.S.C. 154(b) by 569 days.

(21) Appl. No.: 15/733,672

(22) PCT Filed: Mar. 28, 2019

(86) PCT No.: PCT/CN2019/080262
§ 371 (c)(1),
(2) Date: Dec. 1, 2020

(87) PCT Pub. No.: WO2019/185000
PCT Pub. Date: Oct. 3, 2019

(65) Prior Publication Data
US 2021/0084752 A1 Mar. 18, 2021

(30) Foreign Application Priority Data
Mar. 28, 2018 (CN) .................. 201810266779.X

(51) Int. Cl.
*G06K 19/06* (2006.01)
*G06K 7/14* (2006.01)
(Continued)

(52) U.S. Cl.
CPC ......... *H05K 1/0268* (2013.01); *G06K 7/1413* (2013.01); *G06K 19/06028* (2013.01);
(Continued)

(58) Field of Classification Search
CPC ....... G06K 19/06018; G06K 19/06037; G06K 19/06121; G06K 19/06159;
(Continued)

(56) References Cited

U.S. PATENT DOCUMENTS

2005/0236176 A1* 10/2005 Hsu ............... H05K 1/0266
174/250
2007/0173970 A1* 7/2007 Shachar ............. G05B 19/4183
700/225
(Continued)

FOREIGN PATENT DOCUMENTS

CN 101471328 A 7/2009
CN 201522810 U 7/2010
(Continued)

OTHER PUBLICATIONS

Second Office Action in Application No. 201810266779.X; pp. 1-11; dated Sep. 3, 2021; China National Intellectual Property Association; No. 6, Xitucheng Lu, Jimenqiao Haidian District, 100088, Beijing, China.
(Continued)

*Primary Examiner* — Paultep Savusdiphol
(74) *Attorney, Agent, or Firm* — Robert A. Blaha; Smith Tempel Blaha LLC

(57) ABSTRACT

A component carrier related body which includes a stack with a plurality of electrically conductive and/or electrically insulating layer structures, and at least two information carrying structures formed vertically displaced on at least two different of the layer structures, wherein at least two of
(Continued)

the at least two information carrying structures are laterally displaced in a plan view on the stack.

28 Claims, 8 Drawing Sheets

(51) Int. Cl.
  *H05K 1/02* (2006.01)
  *H05K 3/00* (2006.01)
(52) U.S. Cl.
  CPC ......... *H05K 1/0269* (2013.01); *H05K 3/0005* (2013.01); *H05K 2201/09927* (2013.01); *H05K 2201/09936* (2013.01); *H05K 2203/163* (2013.01)
(58) Field of Classification Search
  CPC .......... H05K 2201/09927; H05K 2201/09936; H05K 2203/163
  USPC ................................................. 235/494, 487
  See application file for complete search history.

(56) References Cited

U.S. PATENT DOCUMENTS

| | | | |
|---|---|---|---|
| 2007/0204086 A1 | 8/2007 | Dillard et al. | |
| 2009/0101391 A1* | 4/2009 | Yang ........................ | H05K 9/00 174/250 |
| 2013/0069908 A1 | 3/2013 | Sung | |
| 2016/0037637 A1* | 2/2016 | Carlson ................ | H05K 1/0269 174/266 |
| 2017/0118880 A1* | 4/2017 | Faraci .................. | H05K 1/0269 |

FOREIGN PATENT DOCUMENTS

| | | | |
|---|---|---|---|
| CN | 102271464 | A | 12/2011 |
| CN | 107041063 | A | 8/2017 |
| CN | 207022286 | U | 2/2018 |
| CN | 108345173 | A | 7/2018 |
| CN | 109033917 | A | 12/2018 |
| CN | 110392480 | A | 10/2019 |
| EP | 1622431 | A1 | 2/2006 |
| GB | 2196184 | A | 4/1988 |
| KR | 20130143365 | A | 12/2013 |
| KR | 101387231 | B1 | 4/2014 |
| TW | M432105 | U | 6/2012 |
| TW | M432105 | U1 | 6/2012 |

OTHER PUBLICATIONS

English Translation of cover of Second Office Action in Application No. 201810266779.X; pp. 1-3; dated Sep. 3, 2021; China National Intellectual Property Association; No. 6, Xitucheng Lu, Jimenqiao Haidian District, 100088, Beijing, China.

Castagnola, B.; Communication in Application No. EP 19 77 6872 in the European Patent Office; pp. 1-10; dated Apr. 19, 2021; European Patent Office; 80298, Munich, Germany.

First Office Action in Application No. 201810266779.X in China; pp. 1-13; dated Feb. 22, 2021; China National Intellectual Property Administration; No. 6, Xitucheng Lu, Jimenqiao Haidian District, Beijing City, 100088, China.

English Translation of Cover Page of First Office Action in Application No. 201810266779.X in China; pp. 1-3; dated Feb. 22, 2021; China National Intellectual Property Administration; No. 6, Xitucheng Lu, Jimenqiao Haidian District, Beijing City, 100088, China.

* cited by examiner

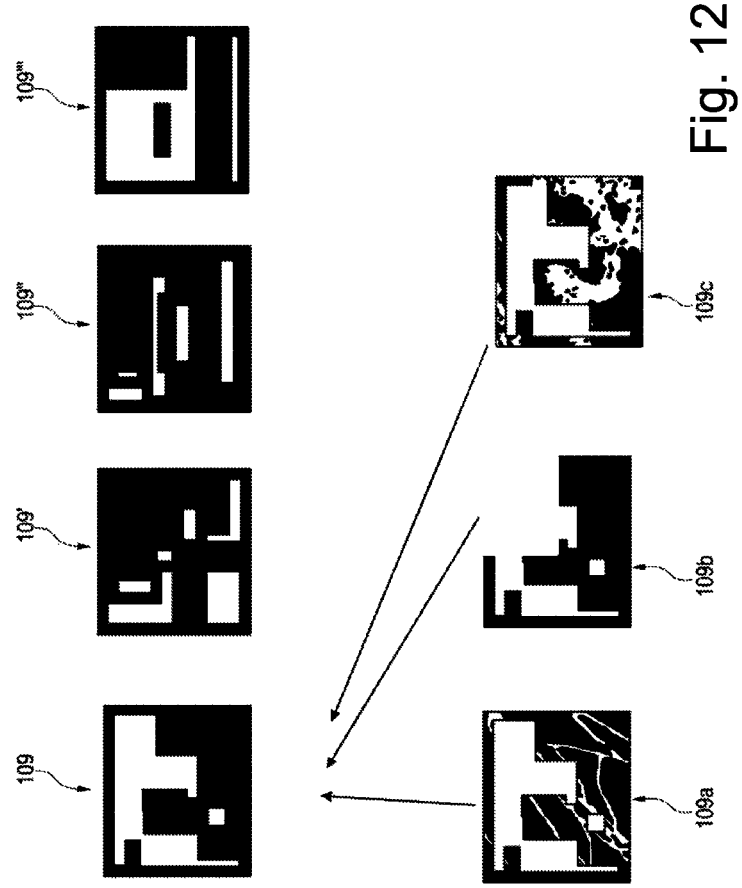

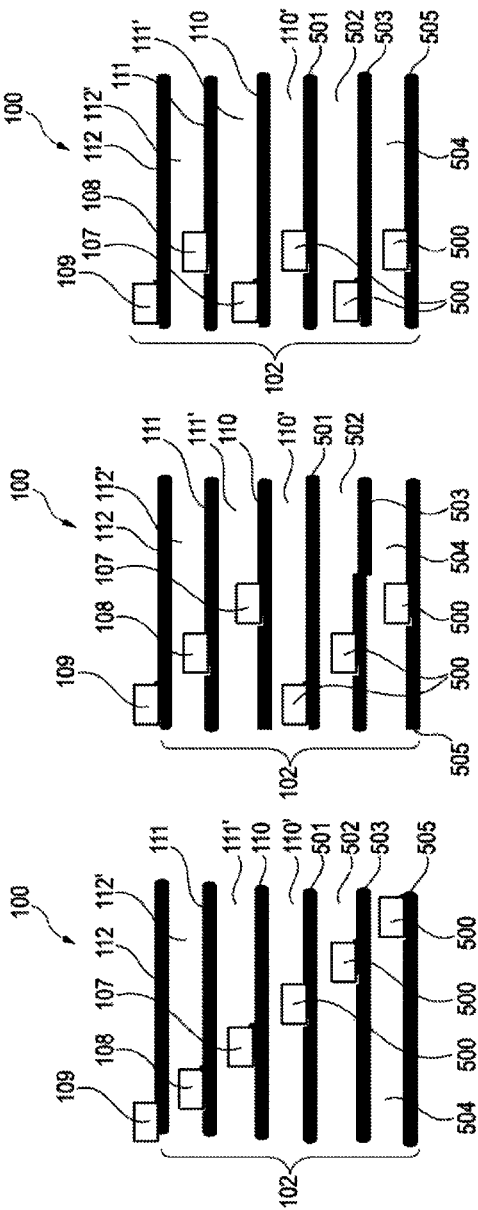

TRACEABILITY OF SUBSEQUENT LAYER STRUCTURE MANUFACTURING OF MAIN BODY FOR COMPONENT CARRIERS BY MEANS OF LATERALLY AND VERTICALLY DISPLACED INFORMATION CARRYING STRUCTURES

CROSS-REFERENCE TO RELATED APPLICATIONS

The present application is a U.S. national phase application that emerged from the International Application No. PCT/CN2019/080262, filed Mar. 28, 2019, which designated the U.S. and claimed priority to China Patent Application No. 201810266779.X, titled "Two-Code Traceability System for Component Carriers," filed with the China National Intellectual Property Administration on Mar. 28, 2018, the entire contents of which is incorporated herein by reference.

TECHNICAL FIELD

The invention relates to a component carrier related body, a method of manufacturing a component carrier related body, an arrangement, a computer-readable medium, and a program element.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

Traceability of component carriers or pre-forms thereof, i.e. the capability to trace and identify component carriers related bodies for instance during manufacture and/or use, is desirable. Tracing component carrier related bodies may allow verifying the history, location, or application of an individual component carrier related body.

SUMMARY

There may be a need to efficiently trace component carriers and/or pre-forms thereof.

According to an exemplary embodiment of the invention, a component carrier related body is provided, wherein the component carrier related body comprises a stack comprising a plurality of electrically conductive and/or electrically insulating layer structures, and at least two information carrying structures formed vertically displaced on at least two different of the layer structures, wherein at least two of the at least two information carrying structures are laterally displaced in a plan view on the stack.

According to another exemplary embodiment of the invention, a meth-od of manufacturing a component carrier related body is provided, wherein the method comprises forming a stack comprising a plurality of electrically conductive and/or electrically insulating layer structures, and forming at least two information carrying structures vertically displaced on at least two different of the layer structures and so that at least two of the at least two information carrying structures are laterally displaced in a plan view (or in a projection) on the stack.

According to another exemplary embodiment of the invention, an arrangement is provided which comprises a component carrier related body having the above mentioned features and being separated or separable into a plurality of component carriers and into a residual structure, wherein the residual structure comprises the information carrying structures, and each of the component carriers comprises a carrier-related information carrying structure, and a database including data sets, wherein a respective data set is correlated to at least part of the information carrying structures and comprises information related to a manufacturing process of the component carrier related body, and wherein each of the data sets links a respective one of the carrier-related information carrying structures to at least one of the information carrying structures relating to the component carrier related body based on which the respective component carrier has been manufactured.

According to still another exemplary embodiment of the invention, a program element (for instance a software routine, in source code or in executable code) is provided, which, when being executed by a processor (such as a microprocessor or a CPU), is adapted to control or carry out a method having the above-mentioned features.

According to yet another exemplary embodiment of the invention, a computer-readable medium (for instance a CD, a DVD, a USB stick, an SD card, a floppy disk or a hard disk, or any other (in particular also smaller) storage medium) is provided, in which a computer program is stored which, when being executed by a processor (such as a microprocessor or a CPU), is adapted to control or carry out a method having the above mentioned features. For instance, the computer program and the data of the database may be stored on a common storage medium such as a server. It is however also possible that the computer program is stored on a first storage medium (such as a first server) and the data of the database is stored on another second storage medium (such as a second server).

Data processing which may be performed according to embodiments of the invention can be realized by a computer program, that is by software, or by using one or more special electronic optimization circuits, that is in hardware, or in hybrid form, that is by means of software components and hardware components.

OVERVIEW OF EMBODIMENTS

In the context of the present application, the term "component carrier" may particularly denote any support structure which is capable of accommodating one or more components thereon and/or therein for providing mechanical support and/or electrical connectivity and/or optical connectivity and/or thermal connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "component carrier related body" may particularly denote either a component carrier (such as a printed circuit board or an IC substrate) itself or a larger body (such as a panel or an array) of multiple component carriers or pre-forms thereof (for instance a semifinished product obtained during manufacturing component carriers individually or in a batch process).

In the context of the present application, the term "layer structure" may particularly denote a continuous layer, a patterned layer or a plurality of non-consecutive islands within a common plane. A layer structure may be electrically insulating and/or electrically conductive.

In the context of the present application, the term "tracking or tracing a component carrier or component carrier related body" may particularly denote an opportunity of a coding system enabling to analyze a component carrier or component carrier related body concerning assigned information carrying structures or identification codes allowing identifying the component carrier or component carrier related body and/or allowing correlating the component carrier or component carrier related body with a specific manufacturing batch or lot (for instance for determining a lot number) and/or a place of manufacture, a manufacturing process (for instance a specific customer order), time (for instance date) or issue (for instance quality issue determined during a product test).

In the context of the present application, the term "information carrying structure" may particularly denote a physical structure assigned to or correlated with a component carrier or a component carrier related body or a layer structure thereof and identifying the former or the latter. In particular, the information carrying structure may be a code structure. Preferably, but not necessarily, an information carrying structure or a combination of information carrying structures may be unique for a certain component carrier or component carrier related body. It is however also possible that an information carrying structure or a combination of information carrying structures is identical for a certain number of component carriers or component carrier bodies, for instance for those manufactured within a common lot or batch. For instance, such an information carrying structure may be a QR code. In such a QR code or other information carrying structure, information such as a link to a specific data set in a database may be included. Additionally or alternatively, such a QR code or other information carrying structure may include a lot number, a panel sequence number, date and time at when the panel is produced (for example at a photo imaging or laser direct imaging (LDI) process). In particular, the manufacturing history of the component carrier related body or a part (for instance a layer structure) thereof may be encoded directly in the respective information carrying structure(s) and/or may be retrieved from a data set in a database to which the information carrying structure(s) is or are linked. In particular, the information carrying structure may be an identification structure. For example, the information carrying structure can be produced by one or more of the following procedures: patterning by a photo process or LDI; applying the information carrying structure by adhering, cutting, scribing, minting, embossing, printing (in particular three-dimensional printing, inkjet printing, etc.); providing the information carrying structure from an electrically conductive material or a dielectric material, wherein the material of the information carrying structure should differ concerning its properties with regards to surrounding material so as to make it readable by a reader device (for instance by providing a darker information carrying structure made out of a corresponding resin to be surrounded by a lighter (for instance at least partially transparent) resin, so that the information carrying structure can be read by a reader device. By at least one lighter resin (can be two or more kinds of more transparent resin as well), the code or information carrying structure can be made of several materials and/or heights. This may be done, for example, for establishing multidimensional codes (for instance a 4D code).

In the context of the present application, the term "database" may particularly denote a data structure which may be stored in a mass storage device such as a hard disk and which may be capable of storing multiple data sets. Certain entities (for instance a control unit or processor of a coding system) may have read and/or write access to the database. The location of the storage device may or may not be the same as the location of processing and/or collecting data, i.e. as the manufacturing location.

In the context of the present application, the term "data set" may particularly denote a number of grouped data elements with fixed correlation to one another. In other words, the combination of the data elements assigned to one specific component carrier or component carrier related body may form the respective data set. For instance, a data set may be composed of information concerning information carrying structures or identification codes of a specific component carrier or component carrier related body and may be composed of auxiliary or meta information. Such auxiliary or meta information may for example relate to a manufacturing process of a component carrier or a component carrier related body.

In the context of the present application, the term "vertically displaced" may particularly denote that the different layer-assigned information carrying structures of the component carrier related body are arranged at different vertical levels of the stack of layer structures, i.e. above each other in a stacking direction. In particular, each of the information carrying structures (which may be a patterned electrically conductive layer structure of the stack) may be formed and positioned on an assigned layer structure (which may be an electrically insulating layer structure of the stack).

In the context of the present application, the term "laterally displaced" may particularly denote that the different information carrying structures of the component carrier related body are arranged in different area regions in a plane or projected plane of the stack of layer structures, i.e. side-by-side in a (in particular horizontal) plane vertically to the stacking direction. By arranging at least each pair of vertically neighbored information carrying structures laterally displaced with regard to one another, it may be ensured that, in a plan view of the stack or a portion thereof both vertically neigh-bored information carrying structures are arranged next to one another and can therefore be read out without being disturbed by a spatial interference. For instance, a touchless optical reader device may read an (for instance exposed) upper information carrying structure of an upper layer structure and may also read a laterally displaced lower information carrying structure (which may be covered by the upper layer structure, but preferably not by the upper information carrying structure) in view of its lateral displacement with regard to the upper information carrying structure.

According to an exemplary embodiment of the invention, a coding system for component carriers or other component carrier related bodies is provided which is based on the formation of information carrying structures for subsequently formed layer structures of a layer stack of the component carrier related body. By not only vertically displacing neighbored information carrying structures assigned to different vertically stacked layer structures but by also laterally displacing adjacent information carrying structures, it can be made possible to read out at least two information carrying structures during manufacturing to thereby correctly link neighbored information carrying structures assigned to neighbored layer structures. In this context, it may be for instance possible to read, with an appropriate reader device, not only a presently exposed uppermost information carrying structure but also a laterally displaced and vertically lower located information carrying structure assigned to a previously formed layer structure. Said buried information carrying structure may still be readable through only one (in particular dielectric) layer structure. This geometric configuration of information carrying structures enables a failure free assignment or correlation between different information carrying structures relating to different layer structures of the same component carrier related body. Thus, information carrying structures assigned to different layer structures and thus different manufacturing stages of the component carrier related body may be correctly assigned also in a database. This may simplify and render accurate tracking of the component carrier related body based on reading out at least one of the information carrying structures by correlation with data sets of the database. Traceability may therefore be possible in a simple and error robust way. Thus, this provides for a simple, highly reliable, failure robust and tamperproof coding system for component carriers or preforms thereof.

It may happen during a manufacturing process that a component carrier related body (such as a panel for manufacturing printed circuit boards) being provided with such information carrying structures may be separated into multiple component carriers (such as printed circuit boards), and that the information carrying structures remain on one or more residue portions (such as a frame) of the component carrier related body, whereas the individual component carriers do not include said information carrying structures. To nevertheless enable proper traceability of the individual component carriers, it may be possible in an arrangement according to an exemplary embodiment of the invention to form a carrier related information carrying structure on each of the individual component carriers (preferably before separation, or alternatively after separation). It may be also advantageous to correlate in a database each individual carrier related information carrying structure with the information carrying structures (in particular the last formed information carrying structure) of the component carrier related body based on which the component carrier has been formed. Thus, by querying the database using the respective carrier related information carrying structure, it may be possible in a very simple way to correlate the carrier related information carrying structure with the data set in the database regarding the manufacturing process of the component carrier related body to which the component carrier belongs. Thus, information which may be included in said data set and corresponding to the manufacturing process also of such component carrier may be reliably retrieved based on the carrier related information carrying structure when the latter is linked to one or more information carrying structures of the assigned component carrier related body. Hence, also traceability on a component carrier basis may be simplified with the described traceability architecture.

In the following, further exemplary embodiments of the component carrier related body, the method of manufacturing a component carrier related body, the arrangement, the computer-readable medium, and the program element will be explained.

In an embodiment, the at least two of the at least two information carrying structures are laterally displaced without overlap in the plan view on the stack. When there is no overlap between adjacent information carrying structures in a plan view, simultaneous readout is possible. This simplifies linking adjacent information carrying structures and therefore adjacent layer structures in a reliably way.

In an embodiment, the at least two laterally displaced information carrying structures are vertically adjoining, neighboring or adjacent ones of the information carrying structures. Since the lateral displacement has the advantage that it allows reading of both laterally displaced information carrying structures (in particular the lower one which may already be covered with a further layer structure), it is advantageous and sufficient when two consecutively formed information carrying structures show the mentioned lateral displacement.

In an embodiment, the at least two of the at least two information carrying structures are laterally displaced in the plan view on the stack for enabling separate reading, in particular optical reading, of the at least two information carrying structures. Such an optical reading may be carried out on an exposed information carrying structure, but also on an information carrying structure being covered by an at least partially transparent layer structure, for instance a prepreg sheet, covering a buried information carrying structure which is nevertheless still optically readable.

In an embodiment, an information carrying structure of a later produced layer structure is linked to an information carrying structure of an earlier produced layer structure. By linking information carrying structures assigned to subsequently produced layer structures, also portions of data sets describing the manufacturing process and/or defects of individual layer structures of the stack may be linked in a database. Linkage between different information carrying structures may be carried out by linking information included in at least part of the information carrying structures and/or may be stored in a data set of the database to which the respective information carrying structures relate.

In an embodiment, each of the at least two information carrying structures includes at least one information from a group consisting of:
  a link to at least part of a data set (which data set may include information indicative of a manufacturing history of the component carrier related body or a part thereof), related to the component carrier related body, of a database,
  information indicative of a manufacturing history of the component carrier related body or a layer structure assigned to a respective one of the information carrying structures (in particular parameters during manufacturing and/or events which occurred during manufacturing),
  a lot number to which the component carrier related body belongs (the term "lot" may particularly denote a set, number or plurality of component carriers manufactured all as part of a batch of component carriers; for instance, a lot may be composed of component carriers (such as printed circuit boards) which have all been integrally connected in a common panel during manufacturing the lot of component carriers),
  a panel sequence number to which the component carrier related body belongs (for instance, a batch of panels being currently processed for manufacturing component carriers may each have a panel number which may be retrievable based on the information carrying structures), and manufacturing time information corresponding to a time of manufacturing the component carrier related body or a time of manufacturing a layer structure assigned to a respective one of the information carrying structures (in particular date and time of manufacture).

Additionally or alternatively, also other kind of information may be stored in the information carrying structure or a data set of a database linked to an information carrying structure. For instance, information about defects of a component carrier related body or a component carrier may be stored in an information carrying structure or a linked data set.

In an embodiment, the information carrying structure of a later produced layer structure includes information included in the information carrying structure of the earlier produced layer structure and includes additional information. Highly advantageously, an information carrying structure of a later produced layer structure may not only include information related to said layer structure, but may also include information which has been previously stored in an earlier created information carrying structure of the component carrier related body. For instance, the later an information carrying structure is formed, the more information may be included in it or in a database link to which it refers as compared to a previously manufactured information carrying structure. It may then be sufficient to read out only a last produced information carrying structure, when it also includes the information of the previously formed information carrying structure(s).

For instance, the information included in the information carrying structure of the earlier produced layer structure is indicative of at least one property of the earlier produced layer structure, in particular at least one property in relation to a manufacture of the earlier produced layer structure. Correspondingly, the additional information may be indicative of at least one property of the later produced layer structure, in particular at least one property in relation to a manufacture of the later produced layer structure. Based on the information carrying structures (optionally in combination with a data set in a database assigned to the information carrying structures), a component carrier related body may be identified and may be assigned to its manufacturing history.

In an embodiment, the component carrier related body comprises at least three information carrying structures on three consecutively produced layer structures. More generally, a multilayer stack may comprise a respective information carrying structure assigned to each individual layer structure so as to allow tracking or tracing the component carrier related body for each layer structure individually.

In an embodiment, the information carrying structure of the earliest produced layer structure is no more readable after having formed the information carrying structure of the last produced layer structure. However, the information carrying structure of the earliest produced layer structure may be still readable immediately before forming the last produced layer structure, or after forming the intermediate layer structure of said three-layer structures. For instance, it may be possible to (in particular optically, more particularly with infrared or X-rays) read a patterned electrically conductive layer structure forming an information carrying structure be-neath one electrically insulating layer structure (in particular beneath one prepreg layer). However, no reading may be possible anymore when multiple additional layers are already arranged on top of one information carrying structure. Reading through a one-layer structure may nevertheless enable reading out two information carrying structures sequentially or simultaneously (in particular one covered and one exposed information carrying structure) on subsequent electrically insulating layer structures, which may be sufficient for establishing a link between them.

In an embodiment, at least one of the information carrying structures, in particular all information carrying structures, is or are configured as one of the group consisting of a QR code, a barcode and an alphanumerical code. More generally, it is possible to configure any of the information carrying structures as a one-dimensional code, a multidimensional code (for instance a two-dimensional code or a three-dimensional code or a four-dimensional code). For example, a one-dimensional code can be a barcode. A two-dimensional code may for instance be PDF417, Data-Matrix-Code, Sema-code, QR-Code, BeeTag, VeriCode, Aztec-Code, MaxiCode, VS-Code or composites thereof. For example, a three-dimensional code may be any code including different colors and/or depth information like hologram codes or High Capacity Color Barcodes and/or codes with different heights. Any of such codes, in particular three-dimensional codes, can be applied by printing. Although many different information carrying structures are possible, use of QR codes for the information carrying structures may be preferred, since a QR code may still be readable even when part thereof is destroyed. Since there may be harsh conditions during manufacturing component carrier related bodies, use of such a failure robust QR code may be advantageous. For example, a four-dimensional code may be a code (such as a QR code) including different heights (in particular of resin) and colors (in particular of resin). Additionally or alternatively, each individual information carrying structure may be formed redundantly on a respective layer structure (for instance twice on a layer structure), so that one of the information carrying structures may still be readable when another one is destroyed. For instance, the information carrying structure may also be any system of words, letters, figures, and/or symbols used to represent others.

In an embodiment, the information carrying structures are patterned portions of electrically conductive layer structures of the stack. Correspondingly, at least one of the information carrying structures may be formed by patterning an electrically conductive layer structure. For instance, this may be accomplished preferably by laser direct imaging (LDI), or alternatively by photoimaging. LDI may use a component carrier or a preform thereof with a photosensitive surface, positioned under a controllable laser. A control unit scans the component carrier or preform thereof into a raster image. Matching the raster image to a predefined metallic pattern corresponding to a respective information carrying structure of said component carrier or preform thereof allows operating the laser to directly generate the image on said component carrier or preform thereof. Advantageously, a highly accurate information carrying structure may be formed by LDI even in an environment with harsh conditions.

In an embodiment, layer structures of the stack carrying the information carrying structures are electrically insulating layer structures, in particular made of prepreg. Prepreg comprises resin, in particular epoxy resin, and optionally reinforcing particles, such as glass spheres. When prepreg is provided as a thin sheet, it may be sufficiently optically transparent so as to enable reading a (in particular copper) information carrying structure directly under the prepreg layer without exposing said information carrying structure before reading it out optically.

In an embodiment, information encoded by the information carrying structures is partially redundant. In particular, information included in a later formed information carrying structure (i.e. on an upper layer structure of the stack) may include more information than an earlier formed information carrying structure (i.e. on a lower layer structure of the stack). A part of the information included in or linked to the later formed information carrying structure may already be stored in or linked to the earlier formed information carrying structure. Due to this partial redundancy, it may be sufficient to retrieve all desired information only by reading out the last formed information carrying structure.

In an embodiment, the method comprises reading, in particular touch-less reading, more particularly optically reading, the information carrying structure of an earlier produced layer structure before forming the information carrying structure of a later produced layer structure, in particular for forming at least part of a data set of a database. In particular, reading a respective information carrying structure may be carried out directly after having formed it. This information may be stored and may be later used for linking the information carrying structure with other information carrying structures.

In an embodiment, the method comprises reading, in particular touch-less reading, more particularly optically reading, the information carrying structure of an earlier produced layer structure while covered by a later produced layer structure through the later produced layer structure after producing the later produced layer structure. According to this highly preferred embodiment, an earlier formed information carrying structure which has meanwhile been covered by another layer structure—the latter also having a spatially displaced further information carrying structure—may be read out through the layer structure in a touchless way by an optical reader device. This may significantly simplify and render accurate establishing a link between the information carrying structure covered by the layer structure and the other information carrying structure on the layer structure, since both reading processes may be carried out simultaneously or immediately after each other.

In an embodiment, the method comprises reading, in particular touch-less reading, more particularly optically reading, the information carrying structure of the later produced layer structure, and linking the information carrying structure of the earlier produced layer structure with the information carrying structure of the later produced layer structure, in particular for forming at least part of a data set of a database. Establishing this link may also allow traceability of component carrier related bodies on the basis of linked information carrying structures which may also be linked to a respective data set in a database.

In an alternative embodiment, the method comprises reading, in particular optically reading, the information carrying structure of an earlier produced layer structure after producing a later produced layer structure and after removing part of the later produced layer structure to thereby expose the information carrying structure of the earlier produced layer structure. Thus, as an alternative to reading an information carrying structure covered by a layer structure for linking said information carrying structure with another information carrying structure, it is also possible to remove part of the material of the layer structure above the covered information carrying structure so as to expose also this information carrying structure. This may allow a more precise readout but requires an additional processing step for exposing.

For instance, the method comprises determining part of information to be encoded by the information carrying structure of the later produced layer structure as information of the information carrying structure of the earlier produced layer structure, in particular information related to a manufacture of the earlier produced layer structure. Correspondingly, the method may comprise determining another part of information to be encoded by the information carrying structure of the later produced layer structure as being indicative of at least one property of the later produced layer structure, in particular information related to a manufacture of the later produced layer structure.

In an embodiment, the method comprises reading a respective one of the information carrying structures by an information carrying structure reader, in particular by an information carrying structure reader configured for a touch-less reading, more particularly by an optical information carrying structure reader. In contrast to an electric read out of an information carrying structure by applying an electric stimulus signal and detecting an electric reply signal in response to the applied electric stimulus signal, an optical and therefore touchless reading is simpler and can be carried out without the risk of damaging the component carrier during reading. Laterally displacing information carrying structures, as well as reading a covered information carrying structure may be properly compatible with optically readout.

In an embodiment, the method comprises reading at least part of the information carrying structures during manufacturing the component carrier related body and storing corresponding information as a data set in a database, the data set being assigned to the component carrier related body. This allows tracking and tracing a component carrier related body or part thereof (in particular a component carrier) by reading an information carrying structure thereof and comparing it with different data sets in the database. A best match between the data sets and the read out information carrying structure may then allow to identify the component carrier related body or part thereof and to obtain information about its manufacturing process.

In an embodiment, the method comprises separating the component carrier related body into a plurality of component carriers, in particular so that the information carrying structures do not form part of the component carriers, but for instance form part of a residue structure (such as a panel frame). Advantageously, the method may further comprise forming a carrier-related information carrying structure on each separated one of the component carriers. Highly preferably, the method may comprise correlating in a data set of a database the carrier-related information carrying structure of a respective one of the component carriers with at least one of the information carrying structures of the component carrier related body. For instance, the above-mentioned information carrying structures may be formed on a frame of a panel, which frame surrounds the individual component carriers during manufacturing component carriers in a batch process (i.e., using a continuous panel as component carrier related body). After separating or singularizing the individual component carriers (for instance by routing, sawing, dicing, etching or laser cutting) the information carrying structures of the panel may remain part of the residue structure and may no longer form part of the individual component carriers. By forming carrier related information carrying structures on each individual component carrier and by linking the carrier related information carrying structures with the information carrying structures of the residue structure and being linked to a specific data set in a database, it may be possible to track the individual component carriers (such as printed circuit boards, PCBs, or integrated circuit (IC) substrates) by a correlation between the assigned carrier related information carrying structure and the information carrying structures of the residue structure which may be linked to a specific data set in the database.

In an embodiment, the method comprises granting an entity, being assigned to a subset of component carriers with assigned data sets, an access right to exclusively access, in particular via a communication network, data sets relating to the subset of component carriers assigned to the entity. For instance, a specific user or entity may have the authorization to access a selected or specific part of the database only, i.e. the part of the database relating to component carriers which are assigned to this user or entity. When the user or entity wishes to access the mentioned part of the data-base via the communication network (for instance the public Internet), authorization of the user or entity to get the requested information corresponds to the provided information concerning the respective information carrying structure. Thus, the information carrying structure of the component carrier related body (such as component carriers) may not only be used for retrieving a data set in the database assigned to this component carrier related body, but may also serve as an authorization right to get access to the corresponding specific portion of the database.

In an embodiment, the arrangement comprises a data interface configured to provide the information related to the manufacturing process of the component carrier related body to which a respective one of the carrier-related information carrying structures belongs in reply to a request identifying the respective one of the carrier-related information carrying structures. Such a request may be sent over the above-described communication network, for instance as a communication message (such as an email or control command, for instance sent via a browser).

In an embodiment, the component carrier related body comprises a stack of at least one electrically insulating layer structure and at least one electrically conductive layer structure. For example, the component carrier related body may be a laminate of the mentioned electrically insulating layer structure(s) and electrically conductive layer structure(s), in particular formed by applying mechanical pressure and/or thermal energy. The mentioned stack may provide a plate-shaped component carrier related body capable of providing a large mounting surface for further components and being nevertheless very thin and compact.

In an embodiment, the component carrier related body is shaped as a plate. This contributes to the compact design, wherein the component carrier related body nevertheless provides a large basis for mounting components thereon. Furthermore, in particular a naked die as example for an embedded electronic component, can be conveniently embedded, thanks to its small thickness, into a thin plate such as a printed circuit board. A plate-shaped component carrier related body also ensures short electric connection paths, and therefore suppresses signal distortion during transport.

In an embodiment, the component carriers formed on the basis of a related body such as a panel is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, each of the above mentioned electrically insulating layer structures comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up material, polytetrafluoroethylene (Teflon®), a ceramic, and a metal oxide. Teflon is a registered mark of The Chemours Company FC LLC of Wilmington, Delaware, U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, each of the above mentioned electrically conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier further comprises an electronic component mounted on and/or embedded in the component carrier material, in particular in the stack. For instance, the electronic component may be a radiofrequency semiconductor chip configured for emitting and/or receiving radiofrequency signals via the wiring structures and being electrically coupled with the electrically conductive wiring structures. Hence, the electronic component may be configured for executing a radio frequency application, in particular a radio frequency application involving frequencies above 1 GHz.

At least one component may be surface mounted on and/or embedded in the component carrier and can in particular be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electro-magnetic radiation propagating from an environment, may be used as component.

In an embodiment, the component carrier related body is a laminate-type component carrier. In such an embodiment, the component carrier is a compound of multiple layer structures which are stacked and connected together by applying a pressing force and/or heat.

The aspects defined above and further aspects of the invention are apparent from the examples of embodiment to be described hereinafter and are explained with reference to these examples of embodiment.

BRIEF DESCRIPTION OF THE DRAWINGS

FIG. 12 illustrates different information carrying structures of a traceability system for component carriers and illustrates how a partially defective information carrying structure can be correctly identified according to an exemplary embodiment of the invention.

FIG. 13, FIG. 14 and FIG. 15 illustrate cross-sectional views of component carrier related bodies according to exemplary embodiments of the invention with laterally displaced information carrying structures arranged in such a way that each pair of information carrying structures in adjacent layer structures is readable by an optical reader device.

DETAILED DESCRIPTION OF THE ILLUSTRATED EMBODIMENTS

Figure 1:
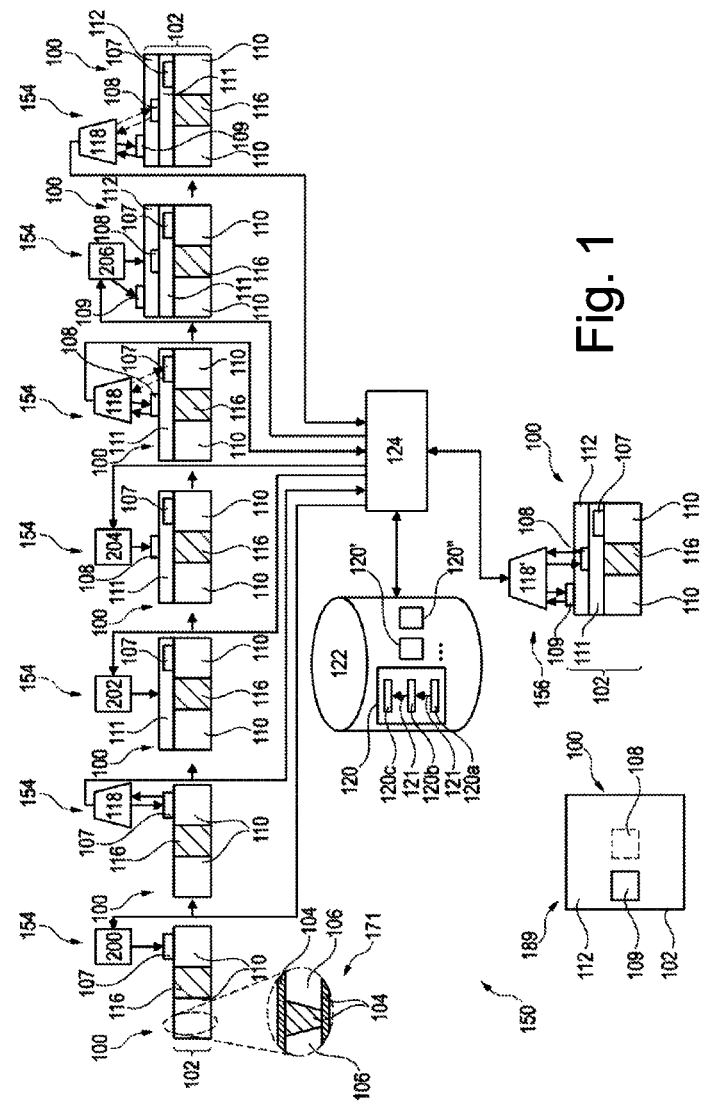
FIG. 1 illustrates a traceability system for component carriers according to an exemplary embodiment of the invention.

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the invention have been developed.

According to an exemplary embodiment of the invention, an electronic mapping and traceability system for tracing component carrier related bodies (such as component carriers, for instance printed circuit boards, PCBs) is provided.

In an embodiment, an electronic data set may be established by electronic mapping. A traceability system may be formed by creating two-dimensional barcodes (in particular QR codes) on different layer structures of a component carrier related body (in particular on every layer during multi-layer PCB manufacturing). Such a system may be implemented at inner layer and outer layer processes during manufacturing component carriers, such as during photoimaging, laser direct imaging (LDI), automatic optical inspection (AOI), solder mask ultraviolet direct imaging (SM UVDI) processing, electric test, sorting, laser marking, final inspection, automated visual inspection (AVI), packing and shipping, etc. Information concerning a presently generated layer structure may be combined with information generated for subsequent layer structures to generate an electronic mapping file (such as a data set in a database) which can be used for crossing out defect cards and improve or even optimize the efficiency of the back-end processes.

A traceability system according to an exemplary embodiment of the invention may be able to meet the following requirements:

In a first procedure, (in particular two-dimensional) information carrying structures and a corresponding electronic file (or data set) may be provided to manage an array of component carriers or the like. This may involve the following procedure.

Photo imaging or LDI printed unique two-dimensional information carrying structures may be formed on each layer structure on a panel frame, as an example for a component carrier related body.

For every layer structure, defect information and mapping may be stored in a database, for instance on a central server. This information may then be combined with information from the subsequent layer structures.

At solder mask processing (SM UVDI), readable two-dimensional information carrying structures may be printed on each card and array, and links between the two-dimensional information carrying structures with the inner layer information carrying structures may be established.

At an electrical test, after identifying electrical defects, it may be possible to generate and update the electronic file or data set based on the two-dimensional information carrying structure(s) of the (in particular PCB) array.

With the two-dimensional code information and electronic file data, a laser marking and sorting machine laser may cross out defective cards on the array and may sort the arrays according to the number of the crossed-out quantity.

A final inspection station, an automated visual inspection station and a quality control station may read the information carrying structure(s) on the array and may update the electronic (in particular XML, Extensible Markup Language) file with defects information (as may be derived by final inspection and/or automated visual inspection).

Subsequently, packing and shipping sections may output the electronic file for packaging and may submit the cross-out information to a related entity.

In a next procedure, electronic file management and delivery may be carried out:

Each process (from automatic optical inspection, electric test, final inspection, automatic visual control, etc.) may read the two-dimensional code information from one or more former processes, may download the electronic file or data set accordingly, and may then update the defect information into the electronic file of a current station.

It may be possible to generate the electronic file or data set according to a lot number.

The system may collect all defined defect and cross out information that can be used for process traceability and commonality analysis.

Such a concept has a number of advantages: it may involve linking of information between different layers in a multi-layer PCB board by using two-dimensional information carrying structures printed on each layer structure of a component carrier stack. Information carrying structure reading of an inner layer underneath an existing layer may be possible. By taking this measure, it may be possible in particular to derive defect information concerning component carrier related bodies. It may also be possible to laser a cross out marker on an outer layer for defects occurred in an inner layer. In embodiments, it may also be possible to establish a heat mapping for card level defects for all layer structures. A tracing system for process and defect information may be collected in all related stations, enabling a further refined traceability. As a result, a fully electronic traceability system for PCB manufacturing may be obtained. It may also be possible to skip defect cards at back-end processes (such as electric test, automatic visual inspection, etc.). Obtained information may also be used for yield analysis and improvement. By involving the concept of co-structures assigned to each layer structure, it may be possible to expand the use on all processes for a complete traceability function.

Exemplary embodiments of the invention may involve the creation of an electronic file or data set, electronic mapping, and traceability system by creating two-dimensional barcodes or other information carrying structures on every layer for a multi-layer component carrier (in particular PCB) manufacturing process.

Information generated on each layer may be combined advantageously with the subsequent layers to generate an electronic file or data set which can be used for crossing out defect cards and improve or even optimize the efficiency of the back-end processes. Thus, an embodiment may involve the use of a two-dimensional code from an inner layer (such as a core) until an outer layer of a layer stack of a component carrier related body. Exemplary embodiments of the invention allow for an efficient defect and commonality analysis for each combined layer, for instance during automatic optical inspection. This may allow to improve efficiency by skipping repair on cards that already have defects in the previous layers. It may be possible to improve efficiency by skipping back-end processes such as electric test, automatic visual inspection and final inspection for defect cards.

FIG. 1 illustrates a traceability system 150 for component carrier related bodies 100, for instance component carriers such as printed circuit boards (PCB) with an embedded component 116 (such as a semiconductor chip), according to an exemplary embodiment of the invention. FIG. 1 in particular shows two different phases during the lifetime of a component carrier as example for a component carrier related body 100, i.e., a manufacturing phase 154 during which the component carrier related body 100 is manufactured and a use phase 156 during which a readily manufactured component carrier related body 100, for instance a PCB, is used by a user.

The manufacturing process of FIG. 1 is described, for the sake of simplicity, based on a single component carrier. Usually, component carriers are manufactured in a batch procedure, in particular on panel level. Thus, the multiple code system implemented according to FIG. 1 for the component carrier can also be applied to a panel or array of component carriers, i.e. to any desired component carrier related body 100. In particular, information carrying structures 107 to 109 may also be connected to the panel and/or array rather than fully on the component carrier which comprises a layer stack 102.

First referring to the manufacturing phase 154, the traceable component carrier related body 100 is manufactured by forming a first information carrying structure 107 on a first layer structure 110 by a first manufacturing unit 200. The first information carrying structure 107 may be a QR code. More precisely, the first information carrying structure 107 is physically formed on a core (such as fully cured FR4 material, for example epoxy resin with reinforcing glass fibers therein) as first layer structure 110 which will be located inside of the component carrier 100 at the end of the manufacturing phase 154. As can be taken from detail 171, the core may comprise electrically conductive layer structures 104 (in particular patterned copper foils, a copper filled laser via, etc.) connected with the dielectric material of the core (prepreg in the present example), which may also be denoted as electrically insulating layer structure 106. As described below in further detail, the first information carrying structure 107 may be formed by a unique pattern of a correspondingly patterned electrically conductive layer on the core.

Thereafter, the first information carrying structure 107 may be read by a touchless reader device 118 such as an infrared reader.

Data content characterizing the or being assigned to the first information carrying structure 107, which may be unique for a specific component carrier related body 100, may be stored as a first data element 120a of a data set 120 stored in a database 122 of a mass storage device (such as a hard disk) during the manufacturing phase 154. Data content which may be included in the first information carrying structure 107 may be a link to the dataset 120. Data content which may be included in the first information carrying structure 107 may also include at least one of an identity of the component carrier related body 100, a manufacturing batch or lot assigned to the component carrier related body 100, a date and time of processing of the layer structure 110 assigned to the first information carrying structure 107, potential defect data concerning processing of the layer structure 110, etc. The mentioned data set 120 is assigned to and is correlated with the specific individual component carrier related body 100 carrying the first information carrying structure 107. The result of the reading or detection of the first information carrying structure 107 may be used for creating the data set 120, more specifically for creating first data element 120a of the data set 120 relating to first information carrying structure 107.

After forming and reading the first information carrying structure 107, the manufacturing process continues: A second layer structure 111, for instance a prepreg sheet, may be laminated on the core or first layer structure 110 and the embedded component 116 by a second manufacturing unit 202.

After this, a second information carrying structure 108 is formed by a third manufacturing unit 204 on the second layer structure 111, in the shown embodiment by photoimaging. The second information carrying structure 108 may be a further QR code. The first and second information carrying structures 107, 108 are vertically displaced from each other, i.e. are formed at different vertical levels of the stack 102. Moreover, the first and second information carrying structures 107, 108 are laterally or horizontally displaced from each other i.e. do not overlap in a plan view or when viewed from above.

This simplifies subsequent readout of both information carrying structures 107, 108 by reader device 118. Data content which may be included in the second information carrying structure 108 may be a link to the dataset 120 and/or to the first information carrying structure 107. Data content which may be included in the second information carrying structure 108 may also include at least one of an identity of the component carrier related body 100, a manufacturing batch or lot assigned to the component carrier related body 100, a date and time of processing of the second layer structure 111 assigned to the second information carrying structure 108, potential defect data concerning processing of the second layer structure 111, etc. It is also possible that the second information carrying structure 108 includes at least part of the information included in or linked by the first information carrying structure 107, for instance concerning processing of first layer structure 110.

Data content indicative of the first information carrying structure 107 and of the second information carrying structure 108, which may be unique for the specific component carrier 100, may then be optically read during the manufacturing procedure by touchless optical reader device 118 based on the emission and detection of infrared radiation. As shown, the second data structure 108 is exposed and can be easily read by reader device 118. In contrast to this, first data structure 107 is now covered by second layer structure 111, which is here embodied as a thin dielectric layer (for instance a prepreg sheet). However, it is nevertheless possible to read the covered first data structure 107 through the second layer structure 111 by the same optical reader device 118 used also for detecting the second information carrying structure 108. Due to this simultaneous or quasi simultaneous reading of information carrying structures 107, 108 by reader device 118, it may be possible to link the information carrying structures 107, 108 based on the reading result. Data indicative of the second information carrying structure 108 may be stored as a second data element 120b, linked to first data element 120a, of the data set 120 in the database 122 during the manufacturing phase 154.

After that, by a fourth manufacturing unit 206, a third layer structure 112 (such as a further prepreg sheet) may be laminated on the second layer structure 111 and on the second information carrying structure 108.

Thereafter, a third information carrying structure 109 is formed on the third layer structure 112, in the shown embodiment for instance by laser direct imaging. The second and third information carrying structures 108, 109 are vertically displaced from each other, i.e., are formed at different vertical levels of the stack 102. Moreover, the first and second and third information carrying structures 107, 108, 109 are laterally or horizontally displaced from each other i.e. do not overlap in a projection, in a plan view or when viewed from above. The third information carrying structure 109 may for instance be a further QR code.

Data content which may be included in the third information carrying structure 109 may be a link to the dataset 120 and/or to the first information carrying structure 107 and/or to the second information carrying structure 108. Data content which may be included in the third information carrying structure 109 may also include at least one of an identity of the component carrier related body 100, a manufacturing batch or lot assigned to the component carrier related body 100, a date and time of processing of the third layer structure 112 assigned to the third information carrying structure 109, potential defect data concerning processing of the third layer structure 112, etc. It is also possible that the third information carrying structure 109 includes at least part of the information included in or linked by the first information carrying structure 107 and/or the second information carrying structure 108, for instance concerning processing of first layer structure 110 and/or second layer structure 111.

Data content indicative of the second information carrying structure 108 and of the third information carrying structure 109, which may be unique for the specific component carrier 100, may then be optically read during the manufacturing procedure by touchless optical reader device 118 based on the emission and detection of infrared radiation. As shown, the third data structure 109 is exposed and can be easily read by reader device 118. In contrast to this, second information carrying structure 108 is now covered by third layer structure 112, which is here embodied as a thin dielectric layer (for instance a prepreg sheet). However, it is nevertheless possible to read the covered second data structure 108 through the third layer structure 112 by the same optical reader device 118 used also for detecting the third information carrying structure 109. Due to this simultaneous or quasi simultaneous reading of information carrying structures 108, 109 by reader device 118, it may be possible to link the information carrying structures 108, 109 based on the reading result. Data indicative of the third information carrying structure 109 may be stored as a third data element 120c, linked to second data element 120b and first data element 120a, of the data set 120 in the database 122 during the manufacturing phase 154.

Referring to FIG. 1, the logical links between the data elements 120a, 120b, 120c and correspondingly between the data structures 107, 108, 109 are indicated by arrows 121.

Furthermore, traceability system 150 comprises a control unit 124 coordinating the manufacturing units 200, 202, 204, 206 and operation of reader device 118 as well as read and write operations in database 122. This is indicated by arrows in FIG. 1.

Although not shown, the manufacturing phase 154 can be continued with any desired number of additional manufacturing procedures. For instance, the readily manufactured component carrier related body 100 may be made subject to a functional test. The test results may also be stored in the data set 120 of the database 122 assigned to component carrier related body 100.

Thus, the data set 120 being specifically assigned as an identifier to the component carrier related body 100 as well as data indicative of the manufacturing process and potential defects correlates information indicative of the first, second and third information carrying structures 107, 108, 109 with the manufacturing method related data and/or optionally other auxiliary or meta data characterizing this specific component carrier related body 100 and its manufacturing process.

As can be taken from FIG. 1, a plurality of further data sets 120', 120", etc. can also be stored in the database 122, each of the data sets 120, 120', 120" being specifically assigned to an individual other component carrier related body (not shown). Thus, a plurality of component carrier related bodies 100 and the database 122 storing the various data sets 120, 120', 120", one for each of the component carrier related bodies 100 form an arrangement allowing traceability of all component carrier related bodies 100 manufactured in accordance with the manufacturing phase 154.

Now referring to the subsequent use phase 156, it may happen that a user needs to retrace the origin, the manufacturing history and/or derive or extract other information concerning a component carrier related body 100 of interest with an identity which is not known by the user. For the purpose of identifying the component carrier related body 100 unknown to the user, the user may operate an optical reader device 118' (which may be the same as reader device 118, or another reader device) for reading information indicative of the exposed third information carrying structure 109 of the component carrier 100 to be retraced or identified. After having read out the third information carrying structure 109, control unit 124 (which can be embodied as one or more processors and which may control the manufacturing and tracing process) may be supplied with the read out information indicative of the third information carrying structure 109. The control unit 124 may then access the database 122 to search for a best match between the read out information indicative of the third information carrying structure 109 and one of the data sets 120, 120', 120", . . . stored in the database 122. A comparison of these data items will result in a best match of the information read out by the reader device 118' with the data set 120.

It may also be optionally possible that the reader device 118' detects data for identifying component carrier related body 100 additionally or alternatively from the covered second information carrying structure 108.

Referring to reference numeral 189, FIG. 1 also depicts the component carrier related body 100 in a plan view or corresponding to a viewing direction of reader device 118, 118'. A direction of the plan view is perpendicular to the main surface of the component carrier related body 100 and, referring to reference numeral 189, perpendicular to the paper plane of FIG. 1. In other words, the plan view may refer to a projection of the constituents of the component carrier related body 100 to the paper plane of FIG. 1 or to the main surface of the component carrier related body 100. As indicated by the view according to reference numeral 189, exposed third information carrying structure 109 and second information carrying structure 108 being covered by third layer structure 112 are laterally displaced in a non-overlapping way in this plan view.

Therefore, it is optionally possible for a reader device 118, 118' to read out both the second and the third information carrying structure 108, 109 without disturbing spatial interference by the respectively other information carrying structure 109, 108.

Although the coding system has been described on the basis of a component carrier such as a printed circuit board (PCB), the coding system can be applied also to any other component carrier related body 100 such as a complete panel comprising multiple component carriers, or an array as a section of a panel for manufacturing the component carriers. In such an embodiment, the information carrying structures 107, 108, 109 of a component carrier related body 100 may be advantageously formed in a region (such as an exterior edge) of the component carrier related body 100 in which region no component carriers are present. The entire extension of the component carrier related body 100 may then be efficiently used for manufacturing a high number of component carriers.

Figure 1A:
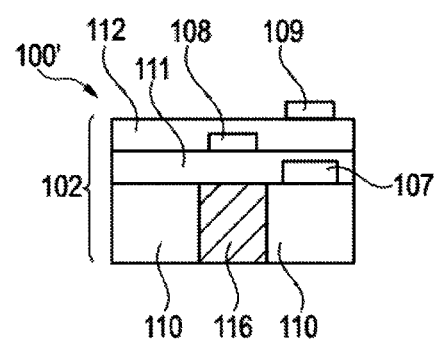
FIG. 1A illustrates a component carrier with information carrying structures being located in an alternative fashion as compared to FIG. 1 according to another exemplary embodiment of the invention.

FIG. 1A illustrates a component carrier related body 100' with information carrying structures 107 to 109 being located in another way as in FIG. 1 according to another exemplary embodiment of the invention.

The component carrier related body 100' according to FIG. 1A differs from the component carrier related body 100 shown in FIG. 1 by the mutual arrangement of the information carrying structures 107 to 109. According to FIG. 1, the information carrying structures 107 to 109 are formed without any mutual overlap in the plan view (see reference numeral 189). According to FIG. 1A, there is no overlap between each two adjacent information carrying structures (i.e. no overlap between first information carrying structure 107 and second information carrying structure 108, and no overlap between second information carrying structure 108 and third information carrying structure 109). However, there is an overlap between first information carrying structure 107 and third information carrying structure 109. This is however not disturbing when a reader device 118, 118' is only used for reading two subsequently formed information carrying structures (107/108 or 108/109). The arrangement according to FIG. 1A is particularly space-saving.

FIG. 1 and FIG. 1A have in common that in both embodiments two respectively vertically adjoining ones of the information carrying structures (i.e., 107 and 108, and 108 and 109) are laterally displaced with respect to one another. In particular, FIG. 1A shows that this condition is sufficient to allow reading of a previously formed information carrying structure (107 or 108) after having formed a subsequently formed information carrying structure (108 or 109) through a respective layer structure (111 or 112). A combined readout of two information carrying structures (i.e., 107 and 108, or 108 and 109) on and relating to adjacent layers structures 110 to 112 may for instance be advantageous for the purpose of linking subsequently formed information carrying structures (107 and 108, or 108 and 109), also in terms of the assigned data set 120 in database 122.

Figure 2:
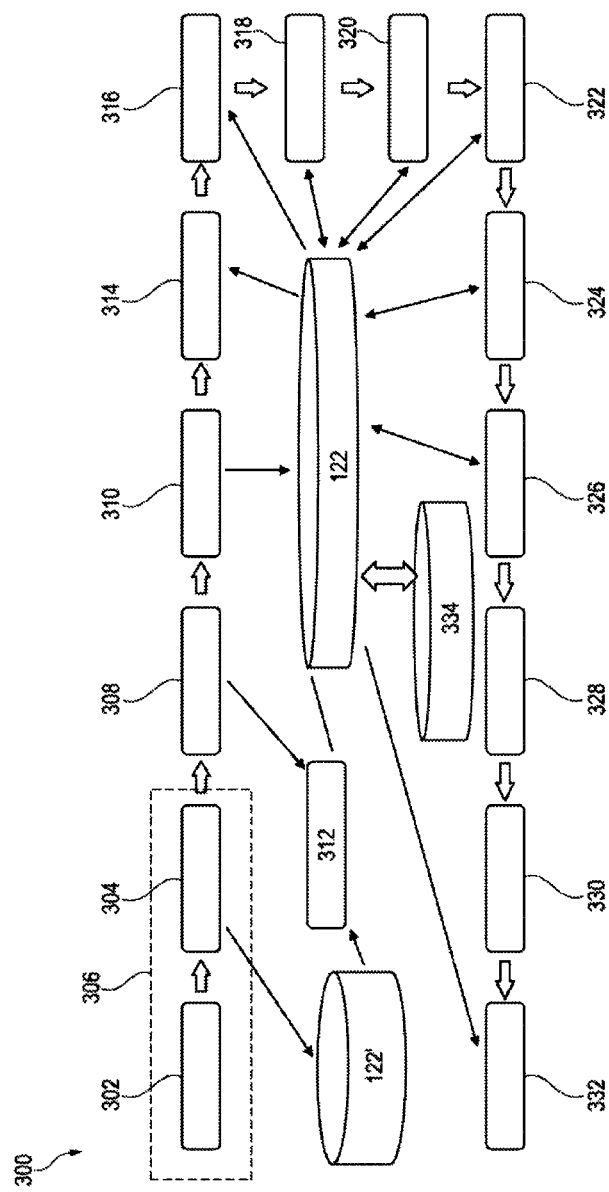
FIG. 2 illustrates a flowchart relating to a traceability system according to an exemplary embodiment of the invention.

FIG. 2 illustrates a flowchart 300 relating to a traceability system 150 according to another exemplary embodiment of the invention.

Referring to block 302, a two-dimensional information carrying structure may be formed on a top side of a panel during a layer exposure procedure. In a subsequent block 304 relating to automatic optical inspection, the two-dimensional information carrying structure of the panel may be read and may be output as an electronic file or data set. The file may for instance be indicative of potential defects. As indicated with reference numeral 306, the procedure according to blocks 302, 304 may be repeated any desired number of times for creating and reading one or more additional panel related information carrying structures, in particular formed on additionally provided layer structures. Information may be exchanged with a panel format database 122'.

Referring to block 308, the previously created panel related information carrying structure may be read, and an array related information carrying structure may be created in a solder mask stage. As indicated by block 312, data conversation from panel format to array format may occur involving database 122' as well as database 122 relating to array format.

Referring to block 310 relating to an electric test, the array related information carrying structure on top side may be read, and an electronic file (such as an XML file) with electric test defect code may be created and may be stored in database 122.

Referring to block 314 relating to a sorting procedure, it is then possible to read the array related information carrying structure. A split may be carried out between arrays passing the electric test and arrays failing the electric test.

In a block 316, a laser mark procedure can be carried out. The array related information carrying structure may be read, and arrays having failed the electric test may be marked.

What follows is a final inspection block 318, an automatic visual inspection block 320, and a quality control block 322.

In a subsequent sorting block 324, the array related information carrying structure may be read and sorting of the laser mark arrays having failed the test may be carried out.

Referring to a further laser mark block 326, the array related information carrying structures may be read. A split may be carried out between arrays having passed the test and arrays having failed the test.

A further sorting block 328 may follow, in which the array related information carrying structures may be read. Mixed lots may be split.

After a subsequent packing block 330, the electronic file or data set may be output, see block 332.

An entity being schematically illustrated with reference numeral 334 may have access to at least part of the database 122.

FIG. 3 to FIG. 6 illustrate component carrier related bodies 100 equipped with information carrying structures 107, 108 of a code system according to an exemplary embodiment of the invention.

Figure 3:
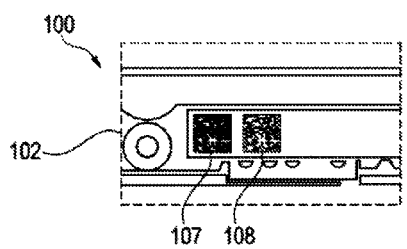
FIG. 3, FIG. 4, FIG. 5 and FIG. 6 illustrate component carrier related bodies equipped with information carrying structures of a code system according to an exemplary embodiment of the invention.

Referring to FIG. 3, information carrying structures 107, 108 printed by laser direct imaging (LDI) are shown.

Figure 4:
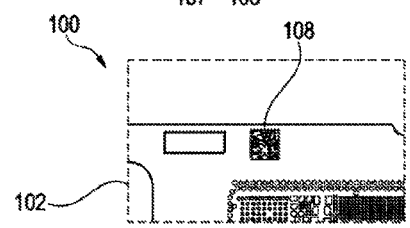
Figure 5:
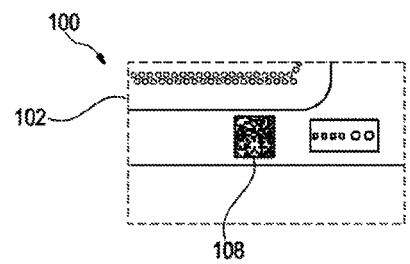

Referring to FIG. 4 and FIG. 5, information carrying structures 108 printed by solder mask and ultraviolet radiation treatment are shown.

Figure 6:
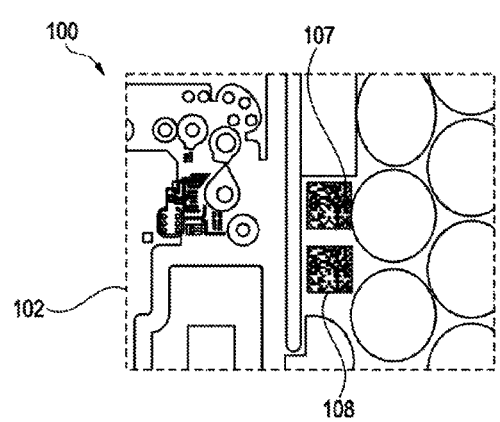

Referring to FIG. 6, a first information carrying structure 107 on a layer below is shown together with a second information carrying structure 108 on an actual layer. Thus, FIG. 6 indicates that reading of both a second information carrying structure 108 on an actual layer as well as first information carrying structure 107 through prepreg material is possible by an infrared optical reader device 118. More specifically, it is possible to print a two-dimensional information carrying structure 107, 108 by LDI on a fixed area of each layer. An optical inspection scanner can then read the second information carrying structure 108 of the actual layer and the first information carrying structure 107 of the layer below in a quick and touchless way. The link between the layers and corresponding information carrying structures 107, 108 may be generated by an appropriate software provided by a server or workstation.

Figure 7:
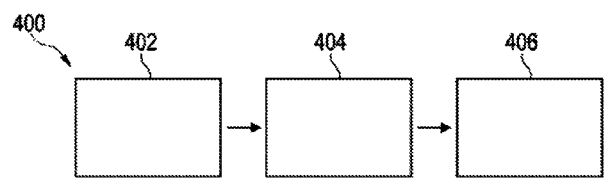
FIG. 7 shows a flowchart according to a manufacturing process of an exemplary embodiment of the invention.

FIG. 7 shows a flowchart 400 according to a manufacturing process of an exemplary embodiment of the invention.

A block 402 indicates that an information carrying structure is formed on a layer structure by photo imaging/laser direct imaging (LDI). Subsequently, a developing and etching procedure may be carried out, compare block 404. Further subsequently, the information carrying structure may be read during automatic optical inspection, compare block 406.

When a printed circuit board (PCB) or other component carrier is manufactured, an imaging process may define circuit traces and a correspondingly formed information carrying structure. LDI only needs to use a computer-controlled, highly focused, laser beam to directly define the circuit pattern onto the board, including the one or more information carrying structures.

A corresponding procedure in terms of LDI may be as follows:
1) The panel is coated with a layer of photoresist
2) The circuit pattern is created onto the board by the laser.
3) Using acid, the areas that were not exposed to the laser beam are then etched, leaving intact the circuit traces and information carrying structure(s) in a copper layer below. The remaining photoresist may then be removed.

Each laser may provide a unique two-dimensional information carrying structure such as a QR code. By touchless reading, more particularly optically reading, it may be possible to read the information carrying structures of a current layer and a previous layer. The information of both layers may then be combined in an electronic file or data set.

Such a procedure may have the advantage that defect mapping and information on each layer of a multi-layer PCB board may be retrieved and used to improve or optimize the efficiency of the subsequent processes.

Figure 8:
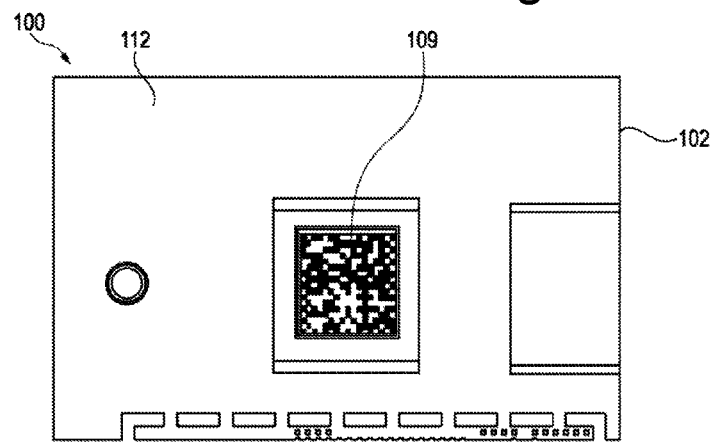
FIG. 8 shows a component carrier with an information carrying structure formed by photoimaging on a layer structure of the component carrier being presently manufactured.

FIG. 8 shows an information carrying structure 109 formed by photoimaging on a layer structure of a stack 102 of a component carrier 100 being presently manufactured. For instance, the information carrying structure 109 shown in FIG. 8 may be manufactured as two-dimensional barcode by photo processing on a surface of the layer structure 112. The two-dimensional barcode according to FIG. 8 can for instance have a size of less than 10×10 mm², for instance approximately 5×5 mm². The shown information carrying structure 109 may be formed by photoimaging a surface layer of layer structure 112, i.e., by patterning the surface of the layer with light.

Figure 9:
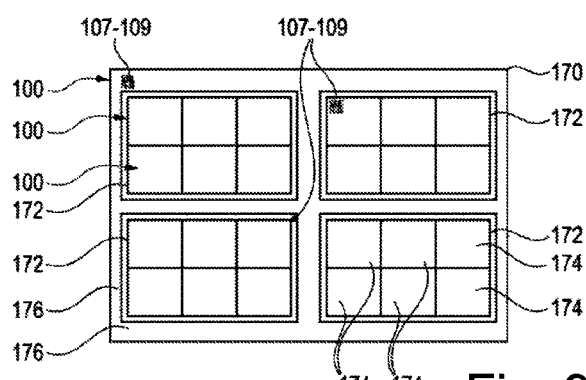
FIG. 9 illustrates a plan view of a panel comprising multiple arrays, each array comprising a plurality of component carriers, as examples for component carrier related bodies according to exemplary embodiments of the invention.

FIG. 9 illustrates a plan view of panel 170 comprising multiple (four in the present embodiment) arrays 172, each comprising a plurality (six in the present embodiment) of component carriers 174, as examples for component carrier related bodies 100 according to exemplary embodiments of the invention. For instance, the panel 170 has a dimension of 18 inches×12 inches. In the shown example, the panel 170 is divided into four quarter panels constituting the arrays 172. In the shown example, each array 172 comprises six component carriers 174. A panel frame 176 surrounds the arrays 172 as an edge portion of the panel 170. Information carrying structures 107 to 109, for instance in the form of QR codes, may be preferably formed in the panel frame 176. Additionally or alternatively, information carrying structures 107 to 109 may also be formed on and/or in the arrays 172 and/or on and/or in the component carriers 174. In the framework of the present application, a component carrier related body 100 may in particular denote a panel 170, an array 172 or a component carrier 174.

Figure 10:
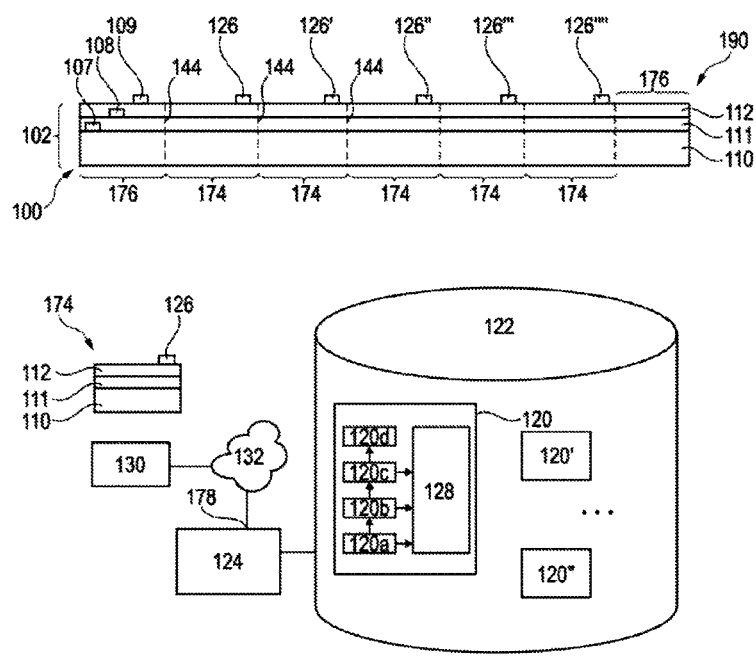
FIG. 10 illustrates a traceability arrangement for component carriers according to an exemplary embodiment of the invention.

FIG. 10 illustrates a traceability arrangement 190 for component carriers 174 of a panel-type component carrier related body 100 according to an exemplary embodiment of the invention.

Referring to FIG. 1, traceability of the component carriers shown in FIG. 1 is enabled by forming the information carrying structures 107 to 109 directly on the component carrier. However, in another scenario, information carrying structures 107 to 109 according to FIG. 1 may be formed on panel level only so that they do not form part of the readily manufactured component carriers. In such a scenario, traceability of the panel-type component carrier related body 100 is possible by the information carrying structures 107 to 109, whereas tracing the separated component carriers may be carried out for instance as described in the following.

FIG. 10 shows an arrangement 190 with a component carrier related body 100 in form of a panel, see reference numeral 170 in FIG. 9. The component carrier related body 100 comprises a plurality of still integrally connected component carriers 174 which have been formed in a batch procedure or on panel level. In other words, processing of the component carriers 174 for instance in the way as shown in FIG. 1 has been carried out while component carrier related body 100 is still an integral structure composed of multiple component carriers 174.

As shown in FIG. 10, the described component carrier related body 100 can be separated at separation lines 144 (for instance by routing, sawing, dicing, laser cutting or etching) into a plurality of component carriers 174 and into a residual structure 176 such as a frame. The residual structure 176 comprises the information carrying structures 107 to 109 used for creating data set 120 in database 122 in a way as described above referring to FIG. 1. Additionally, each of the component carriers 174 comprises a carrier-related information carrying structure 126-126'''', which may also be embodied as QR codes. Thus, the component carrier related body 100 may be separated into the plurality of component carriers 174 so that the information carrying structures 107 to 109 do not form part of the component carriers 174. However, a respective one of the carrier-related information carrying structures 126-126'''' is formed on each of the separate component carriers 174. In order to trace each individual component carrier in a data set 120, 120', 120'' of a database 122, each of the carrier-related information carrying structures 126-126'''' of each respective one of the component carriers 174 may be correlated with one or more of the information carrying structures 107 to 109 of the component carrier related body 100.

For this purpose, the arrangement 190 comprises the database 122 including data sets 120, 120', 120''. Each of the data sets 120, 120', 120'' is correlated to one or more of the information carrying structures 107 to 109 and comprises information related to a manufacturing process of the component carrier related body 100, and thus of the individual component carriers 174 separated therefrom. Furthermore, each of the data sets 120, 120', 120'' links a respective one of the carrier-related information carrying structures 126-126'''' to one or more of the information carrying structures 107 to 109 relating to the component carrier related body 100 based on which the respective component carrier 174 has been manufactured.

For instance, the data elements 120a (linked to information carrying structure 107), 120b (linked to information carrying structure 108) and 120c (linked to information carrying structure 109) may also be correlated with or linked to a further data element 120d which is, in turn, linked to a respective one of the component carriers 174 via a respective one of the carrier-related information carrying structures 126-126''''. This means that if a request is sent to the database 120 requesting information related to an individual one of the carrier-related information carrying structures 126-126'''', the corresponding data set 120 can be found by database search. Due to the link between the individual one of the carrier-related information carrying structures 126-126'''' and its assigned data element 120d to the information carrying structures 107 to 109 and the assigned data elements 120a to 120c, retrieved information content 128 indicative of the manufacturing history of the component carrier related body 100 and therefore of said component carrier 174 can be extracted or identified. The information content 128 may then be output to a requesting entity 130.

FIG. 10 also shows that such an entity 130 can communicate with control unit 124—having access to database 122—via a communication network 132, such as the public Internet. When the entity 130 is in process of the component carrier 174 with a respective one of the carrier-related information carrying structures 126-126'''', information concerning said carrier-related information carrying structure 126-126'''' may be transmitted via the communication network 132 to a data interface 178 of control unit 124 requesting information concerning the manufacturing history of the component carrier 174 to which said carrier-related information carrying structure 126-126'''' belongs. The control unit 124 may then query the database 122 and will find data set 120 matching with said carrier-related information carrying structure 126-126''''. Information content 128 relating to data set 120 and having been stored in data set 120 during manufacturing and reading the information carrying structures 107 to 109 (for instance in a way as described referring to FIG. 1) can then be sent to the entity 130. Thus, it is possible to grant the entity 130, being assigned to or in possession of a respective one of the component carriers 174, an access right to exclusively access, via communication network 132, data set 120 relating to said component carrier 174 assigned to the entity 130. In this context, the data interface 178 may be configured to provide the information related to the manufacturing process of the component carrier related body 100 to which a respective one of the carrier-related information carrying structures 126-126"" belongs in reply to a request identifying the respective one of the carrier-related information carrying structures 126-126"".

Figure 11:
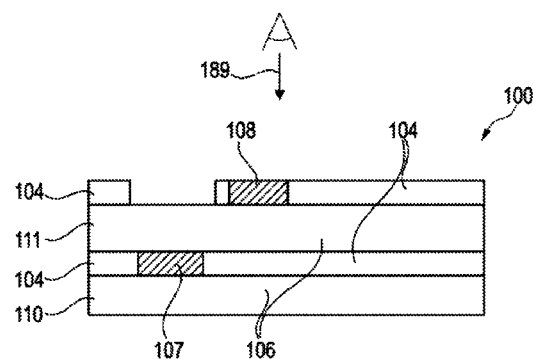
FIG. 11 illustrates a cross-sectional view of a component carrier with information carrying structures according to an exemplary embodiment of the invention in which laterally displaced information carrying structures are readable simultaneously when inspected along a viewing direction perpendicular to a main surface of the plate shaped component carrier.

FIG. 11 illustrates a cross-sectional view of a component carrier related body 100 with information carrying structures 107, 108 according to an exemplary embodiment of the invention in which laterally displaced (in the shown view displaced along the horizontal direction) information carrying structures 107, 108 are readable simultaneously when inspected along a viewing direction 189. For instance, the electrically conductive layer structures 104 may be patterned copper foils and may include the information carrying structures 107, 108. The layer structures 110, 111 may be electrically insulating layer structures 106, for instance prepreg layers.

FIG. 12 illustrates different information carrying structures 109, 109', 109", 109''' of a traceability system 150 (as the one shown in FIG. 1) for component carrier related bodies 100 and illustrates how a partially defective information carrying structure 109a, 109b, 109c can be correctly identified according to an exemplary embodiment of the invention.

In a top row of FIG. 12, four different information carrying structures 109, 109', 109", 109''' are illustrated which carry different information and are assigned to different component carrier related bodies 100 and/or to different layer structures 110 to 112 of a component carrier related body 100. The different information carrying structures 109, 109', 109", 109''' relate to codes applied on a specific layer structure of a layer stack 102 of a respective component carrier related body 100, as stored by software, for instance in database 122. Now referring specifically to information carrying structure 109, it may occur that this information carrying structure 109 is not properly readable by an optical reader 118 because of defects of the information carrying structure 109 itself or of a reading process by reader 118. In a bottom row of FIG. 12, three defective fault codes are shown as partially defective information carrying structures 109a, 109b, 109c. As compared to information carrying structure 109, partially defective information carrying structure 109a shows a scratched code structure, partially defective information carrying structure 109b illustrates that part of the structure is missing, and partially defective information carrying structure 109c shows how a non-related material is accidentally covering the information carrying structure 109 and/or the reader 118.

In order to properly identify a read partially defective information carrying structure 109a, 109b, 109c as representing information carrying structure 109 (rather than one of information carrying structures 109', 109", 109'''), reader device 118, control unit 124 and/or any other processor of traceability system 150 may apply an algorithm in terms of artificial intelligence to correctly identify the read partially defective information carrying structure 109a, 109b or 109c as the information carrying structure 109.

In this context, scanner or reader 118, control unit 124 and/or any other processor of traceability system 150 may be configured or equipped with one or more of the following elements of functionality:

a) Capability of distinguishing between code or an information carrying structure of a lower layer (that is readable through a layer, which may for instance be transparent for infrared radiation and/or X-rays) and code or an information carrying structure of a higher layer (for instance, this distinction can be made based on the properties of the code or information carrying structure: for example, since a lower layer code or information carrying structure may have less intensity than a higher layer code or information carrying structure);

b) Capability of generating and printing unique codes or information carrying structures;

c) Provision of a software with a capability of learning a location of a generated code or information carrying structure; such a software may know which code or information carrying structure was printed on which component carrier related structure (in particular panel, array, card/component carrier, or even layer thereof);

d) Capability of—in case of misreading of an information carrying structure or in case of an unrecognizable information carrying structure—identifying the unreadable or partially unrecognizable information carrying structure based on one or more of the following criteria:

d1) First identifying recognizable information carrier structures (and matching the lower layer information carrier structures with new information carrier structures on higher layer); the leftover information carrier structure which was printed (as per information stored in database) may be matched with the unidentified information carrying structure which could not be properly read by the reader device;

d2) Software knows which information carrier structures have been used on which layer of the component carrier related structure (in particular panel), can compare an unidentified information carrier structure to all information carrier structures that were assigned to that layer and thereby find the appropriate or fitting information carrier structure for which a highest degree of similarities has been found;

d3) Software knows which codes or information carrying structures have been used on what layer of the component carrier related body (in particular panel), knows what should be in place where an unidentified information carrying structure is located, and can use this data to link the unidentified information carrying structure to a new higher layer information carrying structure.

FIG. 13 to FIG. 15 illustrate cross-sectional views of component carrier related bodies 100 according to exemplary embodiments of the invention with laterally displaced information carrying structures 109, 108, 107, 500 arranged in such a way that each pair of information carrying structures (i.e. 109 plus 108, 108 plus 107, 107 plus uppermost 500, uppermost 500 plus middle 500, middle 500 plus lowermost 500) relating to adjacent pairs of layer structures (112 plus 112', 111 plus 111', 110 plus 110', 501 plus 502, 503 plus 504, 505 . . . ) are readable by an optical reader 118.

Referring to FIG. 13, each of the information carrier structures 107 to 109, 500 is laterally displaced with regard to each other of the information carrier structures 107 to 109, 500.

Referring to FIG. 14, each of the information carrier structures 107 to 109 is laterally displaced with regard to each other of the information carrier structures 107 to 109, and each of the information carrier structures 500 is laterally displaced with regard to each other of the information carrier structures 500. However, there is no lateral displacement between a respective one of the information carrier structures 107 to 109 and a respective one of the information carrier structures 500. This is however not disturbing, because the shown arrangement still allows the optical reader 118 to read—during manufacture—a respectively uppermost information carrier structure and—through one of the layer structures—an adjacent lower other information carrier structure.

Referring to FIG. 15, the shown arrangement of the information carrier structures 107 to 109, 500 is similar as in FIG. 14 with the difference that, according to FIG. 15, only two respective pairs (109 plus 108, 107 plus 500, 500 plus 500) of information carrier structures show a lateral displacement. This is however also not disturbing, because the shown arrangement still allows the optical reader 118 to read—during manufacture—a respectively uppermost information carrier structure and—through one of the layer structures—an adjacent lower other information carrier structure.

Thus, if there are for example six information carrying structures 107 to 109, 500 as in FIG. 13 to FIG. 15, they can be all displaced (as in FIG. 13), partially displaced (as in FIG. 14), or—in order to save space—can be horizontally alternatively displaced (for instance in a half-half configuration as shown in FIG. 15).

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A component carrier related body, comprising:
   a stack comprising a plurality of electrically conductive and/or electrically insulating layer structures; and
   at least two information carrying structures formed vertically displaced on at least two different instances of the layer structures;
   wherein a first layer structure comprises at least one first information carrying structure,
   wherein a second layer structure comprises at least one second information carrying structure,
   wherein the first layer structure is arranged on top of the second layer structure without an overlap of the at least one second information carrying structure by any information carrying structure of the first layer structure.

2. The component carrier related body according to claim 1, comprising at least one of the following features:
   wherein the at least two of the at least two information carrying structures are laterally displaced in the plan view on the stack for enabling separate optical reading of the at least two information carrying structures;
   wherein the at least two laterally displaced information carrying structures are vertically adjoining ones of the information carrying structures;
   wherein each of the at least two information carrying structures includes at least one information element from a group consisting of a link to at least part of a database data set related to the component carrier related body, information indicative of a manufacturing history of the component carrier related body or a layer structure assigned to a respective one of the information carrying structures, a lot number to which the component carrier related body belongs, a panel sequence number to which the component carrier related body belongs, and manufacturing time information corresponding to a time of manufacturing the component carrier related body or corresponding to a time of manufacturing a layer structure assigned to a respective one of the information carrying structures.

3. The component carrier related body according to claim 1, wherein the information carrying structure of a later produced layer structure includes information included in the information carrying structure of an earlier produced layer structure and includes additional information.

4. The component carrier related body according to claim 3, comprising at least one of the following features:
   wherein the information included in the information carrying structure of the earlier produced layer structure is indicative of at least one property related to a manufacture of the earlier produced layer structure;
   wherein the additional information is indicative of at least one property related to a manufacture of the later produced layer structure.

5. The component carrier related body according to claim 1, further comprising at least three information carrying structures on three consecutively produced layer structures.

6. The component carrier related body according to claim 5, comprising at least one of the following features:
   wherein the information carrying structure of the earliest produced layer structure of the at least three layer structures is no more readable after having formed the information carrying structure of the last produced layer structure of the at least three layer structures;
   wherein the information carrying structure of the earliest produced layer structure of the at least three layer structures is still readable immediately before forming the last produced layer structure of the at least three layer structures.

7. The component carrier related body according to claim 1, comprising at least one of the following features:
   wherein the information carrying structures is or are configured as one of the group consisting of a QR code, a barcode and an alphanumerical code;
   wherein the information carrying structures are patterned portions of electrically conductive layer structures of the stack;
   wherein layer structures of the stack carrying the information carrying structures are electrically insulating layer structures made of prepreg;
   wherein information encoded by the information carrying structures is partially redundant;
   wherein the component carrier related body is selected from a group consisting of a panel for manufacturing a plurality of component carriers, an array constituting a section of a panel for manufacturing a plurality of component carriers, and a component carrier.

8. The component carrier related body according to claim 1, comprising at least one of the following features:
   at least one component being surface mounted on and/or embedded in the component carrier related body, wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;

wherein at least one of the at least one electrically conductive layer structure comprises at least one of the group consisting of copper, aluminum, nickel, silver, gold, palladium, and tungsten;

wherein at least one of the at least one electrically insulating layer structure comprises at least one of the group consisting of resin, reinforced or non-reinforced resin, epoxy resin or bismaleimide-triazine resin, FR-4, FR-5, cyanate ester, polyphenylene derivate, glass, prepreg material, polyimide, polyamide, liquid crystal polymer, epoxy-based build-up material, polytetrafluoroethylene, a ceramic, and a metal oxide;

wherein the component carrier related body is shaped as a plate;

wherein the component carrier related body is configured as one of the group consisting of a printed circuit board, and a substrate, or a preform thereof;

wherein the component carrier related body is configured as a laminate-type component carrier related body.

9. A method of manufacturing a component carrier related body, comprising:
forming a stack comprising a plurality of electrically conductive and/or electrically insulating layer structures; and
forming at least two information carrying structures vertically displaced from each other on at least two different instances of the layer structures
wherein a first layer structure comprises at least one first information carrying structure,
wherein a second layer structure comprises at least one second information carrying structure,
wherein the first layer structure is arranged on top of the second layer structure without an overlap of the at least one second information carrying structure by any information carrying structure of the first layer structure.

10. The method according to claim 9, comprising at least one of the following features:
touchless reading the information carrying structure of an earlier produced layer structure before forming the information carrying structure of a later produced layer structure for determining information for at least part of a data set of a database;
touchless reading of an earlier produced layer structure while covered by a later produced layer structure through the later produced layer structure after producing the later produced layer structure.

11. The method according to claim 10, further comprising:
touchless reading the information carrying structure of the later produced layer structure; and
linking the information carrying structure of the earlier produced layer structure with the information carrying structure of the later produced layer structure for determining information for at least part of a data set of a database.

12. The method according to claim 9, comprising at least one of the following features:
linking an information carrying structure of a later produced layer structure to an information carrying structure of an earlier produced layer structure by a data set of a database;
determining part of information to be encoded by the information carrying structure of a later produced layer structure based on the information carrying structure of an earlier produced layer structure;
determining part of information to be encoded by the information carrying structure of a later produced layer structure as information of the information carrying structure of information related to a manufacture of the earlier produced layer structure;
determining another part of information to be encoded by the information carrying structure of the later produced layer structure as being indicative of at least one property related to a manufacture of the later produced layer structure.

13. The method according to claim 9, further comprising:
reading a respective one of the information carrying structures by an information carrying structure reader configured for touchless reading by an infrared information carrying structure reader.

14. The method according to claim 13, further comprising one or more of the following procedures:
distinguishing between an information carrying structure of a lower layer structure read through a layer structure and another information carrying structure of a higher layer structure based on at least one criterion of the group consisting of intensity, contrast and color read by the reader;
determining, learning and/or storing a location of a formed information carrying structure on the component carrier related body for enabling retrieval of said information carrying structure based on said location;
in case of a defective reading of an information carrying structure and/or in case of reading a defective information carrying structure, identifying a correct one of the information carrying structures based on one or more of the following:
firstly identifying at least one recognizable information carrier structure and then identifying a leftover information carrier structure as the defectively read or defective information carrying structure;
identifying the correct information carrier structure based on a highest degree of similarities between read data and the information carrier structures; and
determining a first information which information carrying structure is related to which layer structure of the component carrier related body, determining a second information that should be at a location where a defectively read or defective information carrying structure is located, and processing the determined first and/or second information to link the defectively read or defective information carrying structure to another information carrying structure relating to another layer structure.

15. The method according to claim 9, comprising at least one of the following features:
wherein at least one of the information carrying structures is formed by patterning an electrically conductive layer structure of the stack by laser direct imaging or photoimaging;
reading at least part of the information carrying structures during manufacturing the component carrier related body and storing corresponding information in a data set of a database, wherein the data set is assigned to the component carrier related body.

16. The method according to claim 9, further comprising:
separating the component carrier related body into a plurality of component carriers so that the information carrying structures do not form part of the component carriers;
forming an additional carrier-related information carrying structure on each separated one of the component carriers;
correlating in a data set of a database the carrier-related information carrying structure of a respective one of the component carriers with at least one of the information carrying structures of the component carrier related body;
granting an access right to an entity via a communication network to data sets relating to component carriers assigned to the entity.

17. The method according to claim 9, further comprising:
forming a two-dimensional information carrying structure on a top side of a panel during a layer exposure procedure.

18. The method according to claim 17, further comprising:
during automatic optical inspection, reading an outputting, as an electronic file or data set being indicative of potential defects, the two-dimensional information carrying structure of the panel.

19. The method according to claim 18, further comprising:
repeating the procedure of said forming a two-dimensional carrying structure and of said reading and outputting a number of times for creating and reading one or more additional panel related information carrying structures formed on additionally provided layer structures.

20. The method according to claim 17, further comprising:
creating an array related information carrying structure in a solder mask stage.

21. The method according to claim 20, further comprising:
during an electric test, reading the array related information carrying structure on a top side, creating an electronic file with electric test defect code, and storing the electronic file in a database.

22. The method according to claim 21, further comprising:
during a sorting procedure, reading the array related information carrying structure, and carrying out a split between arrays passing the electric test and arrays failing the electric test.

23. The method according to claim 21, further comprising:
during a laser mark procedure, reading the array related information carrying structure, and marking arrays having failed the electric test.

24. An arrangement, comprising:
a component carrier related body separated or separable into a plurality of component carriers and into a residual structure, the component carrier related body including a stack with a plurality of electrically conductive and/or electrically insulating layer structures; and
at least two information carrying structures formed vertically displaced on at least two different instances of the layer structures;
wherein a first layer structure comprises at least one first information carrying structure,
wherein a second layer structure comprises at least one second information carrying structure,
wherein the first layer structure is arranged on top of the second layer structure without an overlap of the at least one second information carrying structure by any information carrying structure of the first layer structure;
wherein the residual structure comprises residual information carrying structures, and each of the component carriers comprises an additional carrier-related information carrying structure; and
a database including data sets, wherein a respective data set is correlated to at least part of the residual information carrying structures of the residual structure and comprises information relating to a manufacturing process of the component carrier related body,
wherein each of the data sets links a respective one of the carrier-related information carrying structures to at least one of the residual structure information carrying structures relating to the component carrier related body based on which the respective component carrier has been manufactured.

25. The arrangement according to claim 24, further comprising:
a data interface configured to provide the information relating to the manufacturing process of the component carrier related body to which a respective one of the carrier-related information carrying structures belongs in reply to a request identifying the respective one of the carrier-related information carrying structures.

26. A non-transitory computer-readable storage medium, in which a computer program is stored, which computer program, when being executed by one or a plurality of processors, is adapted to carry out or control a method, comprising:
forming a stack comprising a plurality of electrically conductive and/or electrically insulating layer structures;
forming at least two information carrying structures vertically displaced from each other on at least two different instances of the layer structures,
wherein a first layer structure comprises at least one first information carrying structure,
wherein a second layer structure comprises at least one second information carrying structure,
wherein the first layer structure is arranged on top of the second layer structure without an overlap of the at least one second information carrying structure by any information carrying structure of the first layer structure;
directing a touchless reading of an information carrying structure of an earlier produced layer structure before forming a respective information carrying structure of a later produced layer structure information carrying structure responsive to the touchless reading;
directing a touchless reading of a later produced layer structure; and
linking the information responsive to the respective touchless readings of the respective information carrying structures in the database.

27. The computer-readable storage medium of claim 26, further comprising:
determining part of information to be encoded by the information carrying structure of a later produced layer structure based on the information carrying structure of an earlier produced layer structure;

determining part of information to be encoded by the information carrying structure of a later produced layer structure as information of the information carrying structure of information related to a manufacture of the earlier produced layer structure;

determining another part of information to be encoded by the information carrying structure of the later produced layer structure as being indicative of at least one property related to a manufacture of the later produced layer structure.

28. A traceability system, comprising:

a component carrier related body including
- a stack comprising a plurality of electrically conductive and/or electrically insulating layer structures; and
- at least two information carrying structures formed vertically displaced on at least two different of the layer structures;
- wherein a first layer structure comprises at least one first information carrying structure,
- wherein a second layer structure comprises at least one second information carrying structure,
- wherein the first layer structure is arranged on top of the second layer structure without an overlap of the at least one second information carrying structure by any information carrying structure of the first layer structure; and/or configured for carrying out a method including
- determining part of information to be encoded by the information carrying structure of a later produced layer structure based on the information carrying structure of an earlier produced layer structure; and
- determining another part of information to be encoded by the information carrying structure of the later produced layer structure as being indicative of at least one property related to a manufacture of the later produced layer structure.

* * * * *